United States Patent [19]

Feldmann et al.

[11] Patent Number: 5,537,329
[45] Date of Patent: Jul. 16, 1996

US005537329A

[54] APPARATUS AND METHOD FOR ANALYZING CIRCUITS

[75] Inventors: Peter Feldmann, Short Hills; Roland W. Freund, New Providence, both of N.J.

[73] Assignee: AT&T Corp., Murray Hill, N.J.

[21] Appl. No.: 269,230

[22] Filed: Jun. 30, 1994

[51] Int. Cl.$^6$ ............................................. G06G 7/19
[52] U.S. Cl. .............................. 364/489; 364/488; 364/578
[58] Field of Search ................................. 364/488, 489, 364/490, 491, 578, 900; 341/156; 128/700

[56] References Cited

U.S. PATENT DOCUMENTS

| | | | |
|---|---|---|---|
| 3,591,784 | 7/1971 | Cutter et al. | 235/152 |
| 3,601,592 | 8/1971 | Cutter et al. | 235/156 |
| 3,918,395 | 11/1974 | Fernside | 118/8 |
| 4,101,383 | 7/1978 | Wyatt et al. | 195/103.5 R |
| 4,264,566 | 4/1981 | Giles et al. | 423/359 |
| 4,280,388 | 7/1981 | White | 84/1.24 |
| 4,593,378 | 6/1986 | McWhirter et al. | 364/900 |
| 4,665,523 | 5/1987 | Citron et al. | 371/37 |
| 4,755,761 | 7/1988 | Ray, Jr. | 329/50 |
| 4,774,667 | 9/1988 | Kuraoka et al. | 364/426.02 |
| 4,792,787 | 12/1988 | Speiser et al. | 341/156 |
| 4,848,851 | 7/1989 | Kuraoka et al. | 303/100 |
| 4,853,861 | 8/1989 | Ford et al. | 364/424.06 |
| 4,951,264 | 8/1990 | Yamamoto | 367/15 |
| 4,991,093 | 2/1991 | Roberge et al. | 364/413.15 |
| 5,018,086 | 5/1991 | Agarwal | 364/557 |
| 5,047,969 | 9/1991 | Sloane | 364/578 |
| 5,094,127 | 3/1992 | Ishida et al. | 74/866 |
| 5,164,727 | 11/1992 | Zakhor et al. | 341/143 |
| 5,276,629 | 1/1994 | Reynolds | 364/487 |
| 5,278,770 | 1/1994 | Gore et al. | 364/490 |
| 5,282,148 | 1/1994 | Poirot et al. | 364/491 |
| 5,282,213 | 1/1994 | Leigh et al. | 371/22.1 |
| 5,349,541 | 9/1994 | Alexandro, Jr. et al. | 364/578 |
| 5,377,687 | 1/1995 | Evans et al. | 128/700 |

OTHER PUBLICATIONS

"The Generalized Eigenproblem: Pole–Zero Computation", by Stephen Haley, Proceedings of the IEEE, vol. 76, No. 2, Feb. 1988, pp. 103–120.

"Dominant Pole(s)/Zero(s) Analysis for Analog Circuit Design", by Lawrence Pillage et al., IEEE 1989 Custom Integrated Circuits Conference, 1989 IEEE, pp. 21.3.1–21.3.4.

"Fast Simulation of Reflection and Crosstalk Effects using a Pade Approximation", by E. Griese et al., Electromagnetic Compatibility, 5–7, Sep., Conference Publication No. 396, IEE, p. 209–216.

European Patent Office Search Report for Application No. EP 95 30 4267, dated 15 Sep. 1995.

P. Feldman et al., "Efficient Linear Circuit Analysis by Padé Approximation via the Lanczos Process", Transactions on Computer–Aided Design of Integrated Circuits And Systems, vol. 14, No. 5, May 1995, pp. 639–649.

(List continued on next page.)

Primary Examiner—Kevin J. Teska
Assistant Examiner—Russell W. Frejd

[57] ABSTRACT

A circuit analyzer and method are disclosed for generating and outputting a Padé via Lanczos (PVL) approximation of a frequency response of a circuit from input circuit parameters. A processing unit having a processor, memory, and stored programs processes the input circuit parameters, determines a block tridiagonal matrix by an iterative look-ahead Lanczos procedure, and calculates a Padé approximant from the block tridiagonal matrix, including poles, zeros, and residues. The look-ahead Lanczos procedure employs non-singular matrices to ensure numerical stability of the iterative calculation of the components of the block tridiagonal matrix. The output is an approximation of a plurality of frequencies at which any poles and zeros of the impulse response of the circuit occur. A graphical representation of the approximated frequency response is also produced, and qualitative measurements of the accuracy of the approximated poles are provided.

30 Claims, 7 Drawing Sheets

OTHER PUBLICATIONS

G. A. Baker, Jr. and P. Graves–Morris, padé Approximants, Part I: Basic Theory, Addison–Wesley, Reading, MA, pp. 1–43, 1981.

E. Chiprout and M. S. Nakhla, Asymptotic Waveform Evaluation and Moment Matching For Interconnect Analysis, Kluwer Academic Publishers, Norwell, MA, 1994.

J. Vlach and K. Singhal, Computer Methods For Circuit Analysis And Design, Van Nostrand Reinhold, New York, N. Y., pp. 1001–1041, 1983.

Matlab User's Guide, The MathWorks, Inc., Natick, MA, pp. (i) to (iv) and pp. 1–1 to 1–3, 1992.

M. M. Alaybeyi, J. Y. Lee, and R. A. Rohrer, "Numerical Integration Alogrithms and Asymptotic Waveform Evaluation (AWE),", Technical Digest of the 1992 IEEE/ACM International Conf. On Computer–Aided Design, pp. 76–79, Nov., 1992.

E. Chiprout and M. Nakhla, "Generalized Moment–Matching Methods for Transient Analysis of Interconnect Networks", Proc. Of The 29th ACM/IEEE Design Automation Conf., pp. 201–206, Jun. 1992.

R. W. Freund, "The Look–Ahead Lanczos Process for Large Nonsymmetric Matrices and Related Algorithms", Linear Algebra For Large Scale And Real–Time Applications, Kluwer Academic Publishers, Dordecht, The Netherlands, pp. 137–163, 1993.

R. W. Freund, M. H. Gutknecht, and N. M. Nachtigal, "An Implementation of the Look–Ahead Lanczos Algorithm for Non–Hermitian Matrices", SIAM J. Sci. Comput., vol. 14, No. 1, pp. 137–158, 1993.

W. B. Gragg, "Matrix Interpretations and Applications of the Continued Fraction Algorithm", Rocky Mountain J. Math., vol. 4, No. 2, pp. 213–225, 1974.

H. Heeb, A. E. Ruehli, J. E. Bracken, and R. A. Rohrer, "Three Dimensional circuit Oriented Electromagnetic Modeling for VLSI Interconnects", Proc. of the 1992 IEEE International Conf. on Computer Design: VLSI In Computers & Processors, pp. 218–221, Oct. 1992.

X. Huang, Padé Approximation of Linear(ized) Circuit Responses, Ph. D. Dissertation, Department of Electrical and Computer Engineering, Carnegie Mellon University, Pittsburgh, PA< Nov., 1990.

W. Kahan, B. N. Partlett, and E. Jiang, "Residual bounds on Approximate Eigensystems of Nonnormal Matrices", Siam J. Numer. Anal., vol. 19, No. 3, pp. 470–484, 1982.

C. Lanczos, "An Iteration Method for the Solution of the Eigenvalue Problem of Linear Differential and Integral Operators" J. Res. Nat. Bur. Standards, vol. 45, No. 4, pp. 255–282, 1950.

L. T. Pillage and R. A. Rohrer, "Asymptotic Waveform Evaluation for Timing Analysis", IEEE Trans. Computer–Aided Design, vol. CAD–9, No. 4, pp. 352–366, Apr., 1990.

V. Raghavan, J. E. Bracken, and R. A. Rohrer, "AWESpice: A General Tool for the Accurate and Efficient Simulation of Interconnect Problems", Proc. of the 29th ACM/IEEE Design Automation Conf., App. 87–92, Jun., 1992.

V. Raghavan, R. A. Rohrer, L. T. Pillage, J. Y. Lee, J. E. Bracken, and M. M. Alaybeyi, "AWE–Inspired", Proc. Of The IEEE 1993 Custom Integrated Circuits Conf., pp. 18.1.1 to 18.1.8, May, 1993.

A. E. Ruehli, "Equivalent Circuit Models for Three–Dimensional Multiconductor Systems", IEEE Trans. Microwave Theory And Tech., vol. MTT–22, No. 3, pp. 216–221, Mar. 1974.

T. J. Schmerbeck, R. A. Richetta, and L. D. Smith, "A 27MHz Mixed Analog/Digital Magnetic Recording Channel DSP Using Partial Response Signalling with Maximum Likelihood Detection", Technical Digest of the 1991 IEEE International Solid–State Circuit Conf., 136–137, Feb., 1991.

B. R. Stanisic, R. A. Rutenbar, and L. R. Carley, "Mixed–Signal Noise–Decoupling via Simultaneous Power Distribution Design and Cell Customization in Rail", Proc. of the 1994 IEEE Custom Integrated Circuits Conf., 1994.

APPARATUS AND METHOD FOR ANALYZING CIRCUITS

BACKGROUND OF THE INVENTION

1. Field of the Invention

This disclosure relates to analyzers for electrical circuits. In particular, this disclosure relates to an apparatus and method for analyzing linear and linearized circuits and networks to approximate a transfer function in terms of dominant poles, zeroes, and residues.

2. Description of the Related Art

Circuit analysis using probe apparatus and circuit simulators is employed to determine the behavior and response of the interconnected elements of a circuit. As the complexity or degree of interconnectedness of a network of elements and/or the number of elements increases (i.e. becomes "larger") the accurate prediction and full accounting of interconnect effects of various elements, especially if transmission lines, ground planes, antennas, and the like are included, often requires increased computational complexity in circuit analyzers. For example, SPICE-like simulators based on integration of non-linear ordinary differential equations are useful in analyzing nonlinear circuits, but are relatively inefficient for highly interconnected (or "large") circuits or networks.

Techniques are known in the art for large linear circuit analysis. One technique in particular is the Asymptotic Waveform Evaluation (AWE) algorithm described in L. T. Pillage and R. A. Rohrer, Asymptotic Waveform Evaluation for Timing Analysis, IEEE TRANS. COMPUTER-AIDED DESIGN, Vol. CAD-9, pp. 352–366, April 1990; in X. Huang, Padé Approximation of Linear(ized) Circuit Responses, Ph.D. Dissertation, Department of Electrical and Computer Engineering, Carnegie Mellon University, Pittsburgh, Pa., November, 1990; and in V. Raghavan, R. A. Rohrer, T. L. Pillage et al., AWE-Inspired, PROC. OF THE IEEE 1993 CUSTOM INTEGRATED CIRCUITS CONF., May 1993.

AWE is based on approximating the Laplace domain transfer function H(s) of a linear network by a reduced order model using Padé Approximation by computing the leading 2 q moments me, $m_0, m_1, \ldots, m_{2q-1}$ of H(s).

Using circuit equation formulation methods such as modified nodal analysis, sparse tableau, etc. such as described in J. Vlach and K. Singhal, COMPUTER METHODS FOR CIRCUIT ANALYSIS AND DESIGN, Van Nostrand Reinhold, New York, N.Y., 1983; a lumped, linear, time-invariant circuit may be described by the following system of first order differential equations:

$$C\dot{x} = Gx + bu \quad (1)$$

$$y = l^T x + du$$

where the vector x represents the circuit variables; matrix G represents the contribution of memoryless elements, such as resistors; C represents the contribution from memory elements, such as capacitors and inductors; l is an output selection vector for choosing the variables of interest in the circuit for analysis; y is the output of interest; and the terms bu and du represent excitations from independent sources. Hereinafter, variables are scalars unless identified as vectors or matrices, including matrices of vectors.

In determining the impulse response of the linear circuit with zero initial conditions (which is used to determine response behavior to any excitation) the Laplace transformation of the system in Eq. (1) above, assuming zero initial conditions, becomes $$sCX = -GX + bU \quad (2)$$

$$Y = l^T X$$

where X, U and Y denote the Laplace transform of x, u and y, respectively.

The Laplace domain impulse response, or transfer function, H(s) is defined as $$H(s) := \frac{Y(s)}{U(s)} = l^T(G + sC)^{-1}b. \quad (3)$$

Hereinafter, the notation ":=" indicates assignment, definition, or setting a variable accordingly, and $(\ )^{-1}$ indicates the inverse operator for scalars and matrices, accordingly.

Let $s_0 \in \mathbb{C}$ be an arbitrary but fixed expansion point such that the matrix $G + s_0 C$ is non-singular, and using the change of variables $s = s_0 + \sigma$, set $$A := -(G + s_0 C)^{-1} C \quad (4)$$

$$r := (G + s_0 C)^{-1} b$$

Matrix A is hereinafter called the characteristic matrix or circuit characteristic matrix of the circuit, determined from the circuit matrices G and C of the characteristics of the circuit or network.

Eq. (3) may be rewritten as follows:

$$H(s_0 + \sigma) = l^T(\sigma C + G + s_0 C)^{-1} b \quad (5)$$
$$= l^T(I - \sigma A)^{-1} r$$

where I is the identity matrix.

To determine the impulse response $H(s_0 + \sigma)$ from the characteristic matrix A, all of the eigenvalues and eigenvectors of A are to be determined. However, the numerical computation of all eigenvalues and eigenvectors of the matrix A becomes prohibitively expensive computationally for larger sizes of matrix A, so a Padé approximation to the network impulse response $H(s_0 + \sigma)$ is used.

For each pair of integers p, q ≥ 0, the Padé approximation of type p/q to $H(s_0 + \sigma)$ is defined as the rational function $$H_{p,q}(s_0 + \sigma) := \frac{b_p \sigma^p + \ldots + b_1 \sigma + b_0}{a_q \sigma^q + \ldots + a_1 \sigma + 1} \quad (6)$$

whose Taylor series about $\sigma = 0$ (i.e. the Maclaurin expansion) agrees with the Taylor series of $H(s_0 + \sigma)$ in at least the first (p+q+1) terms.

The coefficients of the Padé approximation in Eq. (6) are uniquely determined by the first (p+q+1) Taylor coefficients of the impulse response, and the roots of the denominator and numerator polynomial in Eq. (6) represent approximation to the poles and zeros of the network, respectively.

In the context of impulse response approximations, one may choose p=q−1 so that the Padé approximation is of the same form as the original impulse response. Define $H_q := H_{q-1,q}$. Using $H_q$ as the $q^{th}$ Padé approximant to the impulse response H, and by using a partial fraction decomposition, $H_q$ may be expressed in the form $$H_q(s_0 + \sigma) = k_\infty + \sum_{j=1}^{q'} \frac{k_j}{\sigma - p_j} \quad (7)$$

In AWE, the coefficients of the denominator polynomial of Eq. (6) of $H_q$ are obtained by solving linear systems of order q, as described E. Chiprout and M. S. Nakhla, ASYMPTOTIC WAVEFORM EVALUATION AND MOMENT MATCHING FOR INTERCONNECT ANALYSIS, Kluwer Academic Publishers, Norwell, Mass. 1994. However, as q increases, the computations of AWE to solve the linear system of order q described above is susceptible to extremely ill-conditioned numerical computations, especially in the case when the required order or degree of approximation is "large". A number of strategies such as scaling, frequency shifting, and complex frequency hopping have been proposed to remedy AWE, as described in X. Huang and in E. Chiprout et al., cited above. Such strategies have met with some success.

It is preferable to analyze large linear circuits or networks using a numerically stable method to determine the Padé approximation of the impulse response with little numerical degradation, as well as to provide an acceptable computational cost per order of approximation. It is also advantageous to obtain a qualitative measure of the accuracy of determined poles.

SUMMARY

An apparatus for generating a frequency response signal of a circuit is disclosed, including a processing unit having a processor, associated memory, and stored programs. The memory stores circuit characteristic data representing the circuit. The stored programs include a matrix reduction program for causing the processor to process the circuit characteristic data and to generate block tridiagonal matrix data representing a block tridiagonal matrix relating to the circuit characteristic data from the circuit characteristic data, and to generate the frequency response signal from the block tridiagonal matrix data. The processor then processes the circuit characteristic data to calculate eigenvalues and eigenvectors of the block tridiagonal matrix to generate a Padé approximant of the frequency response signal, including any poles, residues, and zeroes, to predict the performance of an analyzed circuit.

Circuit characteristic data representing the circuit is input through an input device and received and stored in memory. A characteristic matrix is determined from the circuit characteristic data, and the characteristic matrix is iteratively reduced to a block tridiagonal matrix by a look-ahead Lanczos procedure.

The method for generating a frequency response signal of a circuit includes the steps of storing in memory circuit characteristic data representing the circuit; processing the circuit characteristic data to generate characteristic matrix data representing a characteristic matrix using a processor; determining block tridiagonal matrix data representing a block tridiagonal matrix from the circuit characteristic data using a processor operating a matrix reduction program; and generating the frequency response signal from the block tridiagonal matrix data. The method also calculates eigenvalues and eigenvectors of the block tridiagonal matrix from the block tridiagonal matrix data to generate a Padé approximant from poles, residues, and zeroes for generating the frequency response signal.

The method further includes the steps of receiving a plurality of circuit parameters representing the circuit from an input device; storing the received circuit parameters in memory; processing the circuit parameters to generate characteristic matrix data representing a characteristic matrix; performing a Lanczos procedure on the processed parameters using a look-ahead technique; calculating a Padé approximant, including poles and zeros, of a transfer function of the circuit; generating a graphic representation from the Padé approximant to predict the performance of the circuit; and displaying the graphic representation on a display. The look-ahead technique uses non-singular matrices to avoid numerical instabilities. The method also includes iteratively generating and then storing in memory a plurality of intermediate parameters from the processed parameters; generating block tridiagonal matrix data representing a block tridiagonal matrix from the stored intermediate parameters; and generating eigenvalues and eigenvectors of the block tridiagonal matrix to calculate the Padé approximant.

BRIEF DESCRIPTION OF THE DRAWINGS

The features of the disclosed circuit analyzer and method will become more readily apparent and may be better understood by referring to the following detailed description of an illustrative embodiment of the present invention, taken in conjunction with the accompanying drawings, where.

DESCRIPTION OF THE PREFERRED EMBODIMENTS

Figure 1:
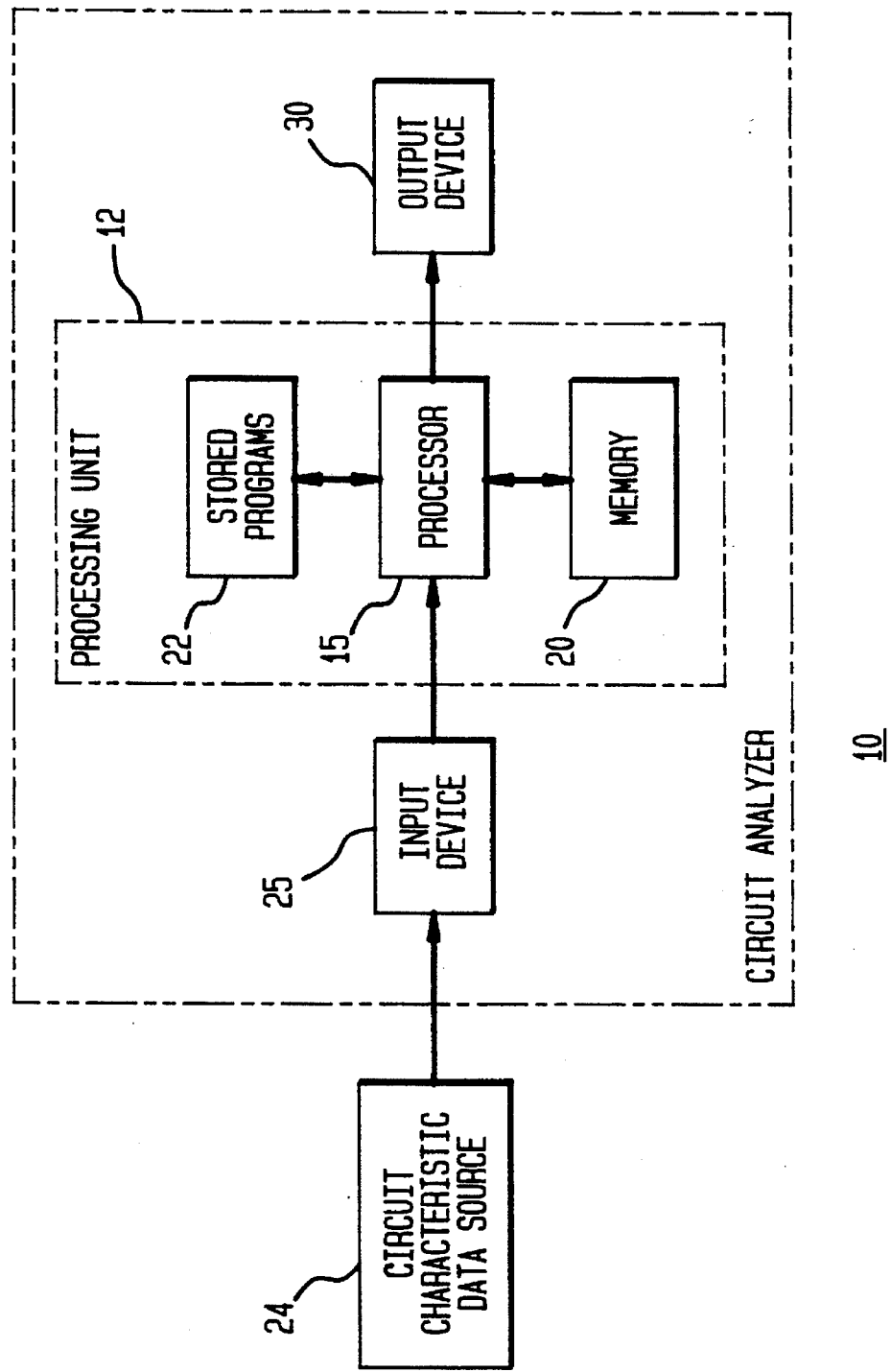
FIG. 1 shows the components of the circuit analyzer disclosed herein.

Referring now in specific detail to the drawings, with like reference numerals identifying similar or identical elements, as shown in FIG. 1, the present disclosure describes an apparatus and method implementing a circuit analyzer 10, which includes a processing unit 12 having a processor 15, memory 20, and stored programs 22 including a matrix reduction program; an input device 25; and an output device 30. In an exemplary embodiment, the processing unit 12 is preferably a SPARC workstation available from Sun Microsystems, Inc. having about 10 MB associated RAM memory and a hard or fixed drive as memory 20. The processor 15 operates using the UNIX operating system to run application software as the stored programs 22 providing programs and subroutines implementing the disclosed circuit analysis system and methods.

The processor 15 receives commands and circuit characteristic data from a circuit characteristic data source 24 through the input device 25 which includes a keyboard and/or a data reading device such as a disk drive for receiving the circuit characteristic data from storage media such as a floppy disk. The received circuit characteristic data are stored in memory 20 for further processing to generate a frequency response signal of the circuit under analysis over a range of frequencies representing the approximated or predicted frequency response of the circuit.

The generated frequency response signal is used by the processor 15 to generate a graphic representation for plotting the approximated impulse response in volts, amps, or other scales versus a range of frequencies. The graphic representation is sent to an output device 30 such as a display for displaying the predicted frequency response of the circuit under analysis. Alternatively, the output device 30 may include specialized graphics programs to convert the generated frequency response signal to a displayed graphic. In additional embodiments, the generated frequency response signal may include determined poles, zeros, and/or residues listed in a file for output as columns or tables of text by the output device 30 which may be a display or a hard copy printer.

The circuit analyzer 10 performs the application programs and subroutines, described hereinbelow in conjunction with FIGS. 2–3, which are implemented from compiled source code in the C++ and/or the FORTRAN programming languages.

The circuit analyzer 10 also includes a method for generating a frequency response signal of a circuit, including the steps of starting the circuit analysis by the Padé via Lanczos (PVL) procedure in step 40; receiving and storing the circuit characteristic data of the circuit in step 45; processing the circuit characteristic data in step 50 to obtain a characteristic matrix A and characteristic vectors 1 and r; reducing the characteristic matrix A using the matrix reduction program of the stored programs 22 in step 55 to produce the block tridiagonal matrix $T_q$ using the look-ahead Lanczos procedure; generating eigenvalues and eigenvectors of the block tridiagonal matrix $T_q$ in step 60; calculating any poles, zeros, and residues from the eigenvalues and eigenvectors in step 65 to generate a Padé approximant of a transfer function of the circuit; and generating and displaying a graphic representation of the performance of the circuit in step 70 as predicted from the Padé approximant.

Figure 2:
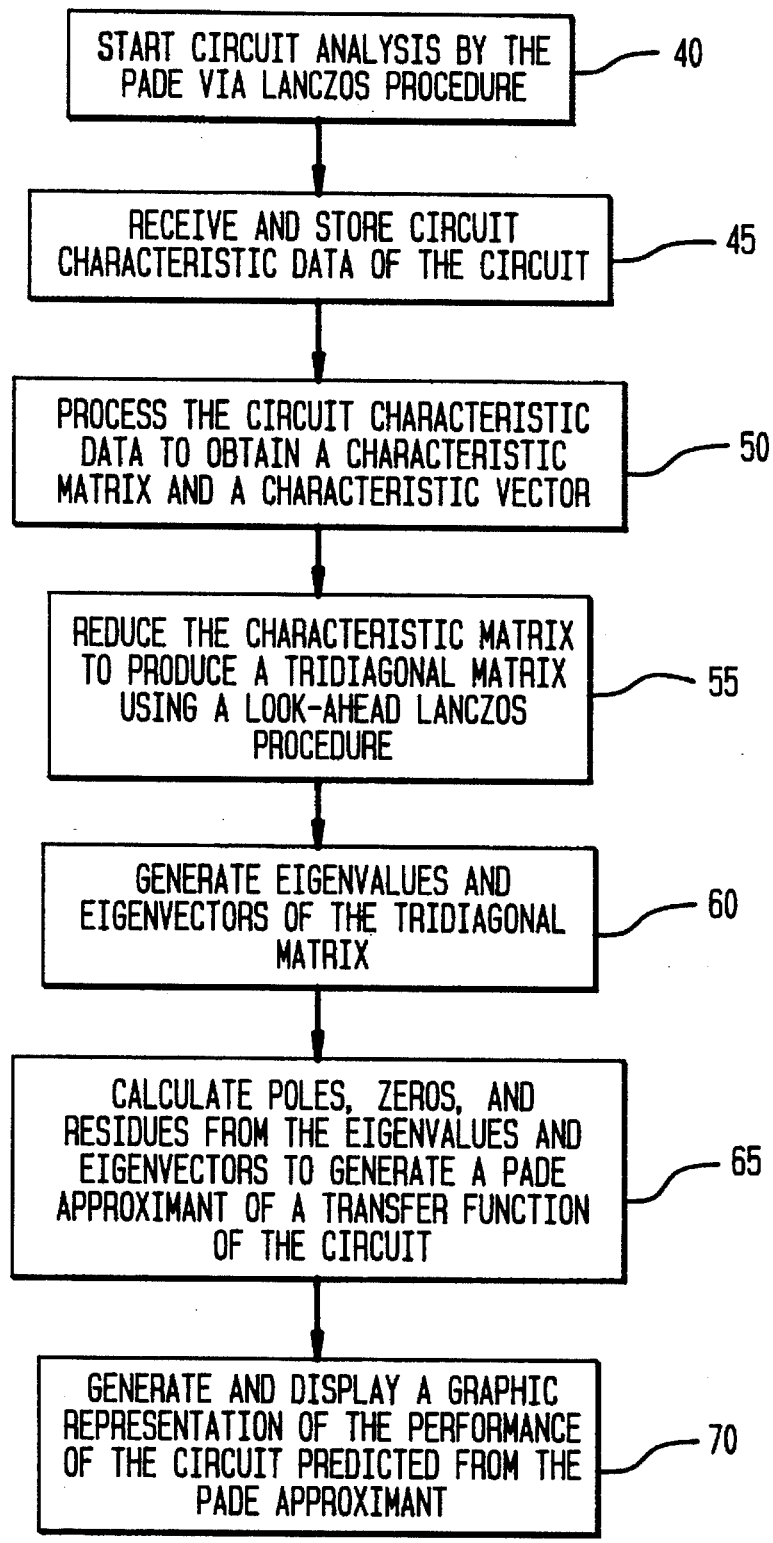
FIG. 2 illustrates a block diagram of the operation of the circuit analyzer to implement a Padé via Lanczos (PVL) approximation of a frequency response.
Figure 3:
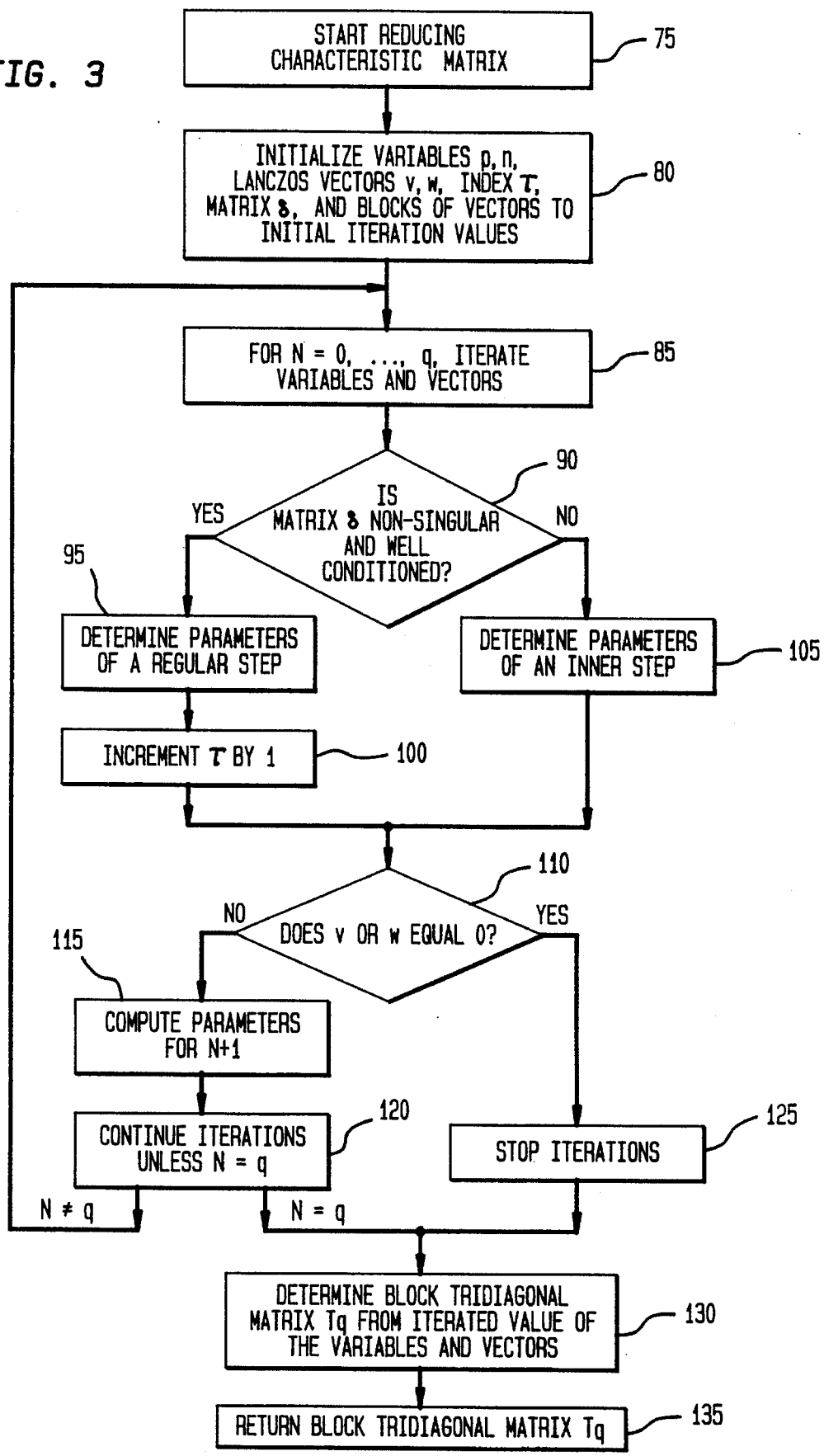
FIG. 3 illustrates a block diagram of a subroutine implementing a look-ahead Lanczos procedure.

As shown in FIG. 3, the step 55 in FIG. 2 for reducing the characteristic matrix A includes a subroutine performing the steps of starting the reduction of the characteristic matrix A in step 75; initializing variables ρ, η Lanczos vectors v, w, index T, matrix δ, and blocks of vectors to initial iteration values in step 80; iterating the variables and vectors in step 85 as described above for values of iteration variable N from 0 to q; determining the block tridiagonal matrix $T_q$ in step 130 from the iterated values of the variable and vectors calculated in step 85; and returning the block tridiagonal matrix $T_q$ in step 135 to the procedure in FIG. 2 to proceed to steps 60–70 to determine the frequency response of the circuit.

Referring to FIG. 3, the iteration of values in step 85 includes the steps of determining if matrix δ is non-singular and well conditioned in step 90; determining parameters of a regular step in step 95; incrementing τ by 1 in step 100; and proceeding to step 110. However, if matrix δ is not non-singular and well conditioned, as determined in step 90, the step of determining parameters of an inner step is performed in step 105; and the subroutine proceeds to step 110. In step 110, the subroutine determines if v or w equals zero. If neither v nor w equals 0, the subroutine computes parameters for N+1 in step 115; and continues the iterations unless N=q. The subroutine then loops back to step 85 to increment N by 1 and performs steps 90–120 unless N=q in step 120, or until v or w equals zero in step 110. At step 110, if v or w equals zero before the FOR N=0, . . . , q loop of step 85 is completed, the subroutine stops iterations and exits the FOR loop in step 125 to proceed to steps 130–135 described above.

Referring back to FIG. 2, the generated eigenvalues and eigenvectors in step 60 are used to determine the poles and residues of the frequency response of the circuit, and $T_q$ as determined in step 55 (in conjunction with the steps shown in FIG. 3) is used to calculate the zeros of the frequency response of the circuit.

As described in C. Lanczos, An Iteration Method for the Solution of the Eigenvalue Problem of Linear Differential and Integral Operators, J. Res. Nat. Bur. 5 Standards, Vol. 45, pp. 255–282, 1950; the Lanczos process is an iterative procedure for the successive reduction of a square matrix A to a sequence of tridiagonal matrices.

The classical Lanczos process uses the inverse or reciprocal of scalars $δ_n$ in determining iterated values of variables in each iteration. As division by 0 may occur if $δ_n=0$, and numerical instabilities may result if $δ_n≈0$, the classical Lanczos process is modified in the circuit analyzer 10 herein described to implement a look-ahead variation as described in R. W. Freund, The Look-Ahead Lanczos Process for Large Nonsymmetric Matrices and Related Algorithms, LINEAR ALGEBRA FOR LARGE SCALE AND REAL-TIME APPLICATIONS, Kluwer Academic Publishers, Dordecht, The Netherlands, pp. 137–163, 1993 (hereafter Freund[1]); and R. W. Freund et al., An Implementation of the Look-Ahead Lanczos Algorithm for Non-Hermitian Matrices, SIAM J. Sci. Comput., Vol. 14, pp. 137–158, 1993 (hereafter Freund[2]).

The circuit analyzer 10 implements the look-ahead technique by replacing inverses of scalars (as in the classical Lanczos method) with inverses of non-singular matrix $δ^τ$ thus avoiding division by zero causing a breakdown of the classical Lanczos method.

Referring to FIG. 3, step 80 is performed as follows: variables ρ, $η_1$, and τ; vectors $v_0$, $w_0$, $v_1$, and $w_1$; and matrix $δ^{(1)}$, $V^{(0)}$, $W^{(0)}$, $V^{(1)}$, $W^{(1)}$ are initially assigned values as follows:

$$\rho_1 := \|r\|_2, \quad \eta_1 := \|l\|_2, \quad \tau := 1, \qquad (8)$$
$$v_0 := w_0 := 0, \quad v_1 := r/\rho_1, \quad w_1 := l/\eta_1,$$
$$V^{(0)} := v_0, \quad W^{(0)} := w_0, \quad V^{(1)} := v_1, \quad W^{(1)} := w_1,$$
$$\text{and } \delta^{(1)} := (W^{(1)})^T V^{(1)},$$

The following steps (1) to (4), corresponding to steps 90–125 in FIG. 3, are then iteratively performed for N=0, . . . , q:

(1) if $δ^τ$ is non-singular and well conditioned, as determined in step 90 in FIG. 3; i.e. not too close to singular (in the exemplary embodiment, the circuit analyzer uses 16 decimal double precision accuracy, so a matrix $δ^{(τ)}$ having a condition number of $10^8$ is the accepted threshold to determine a well conditioned matrix), perform steps (2) and (4) below (steps 95–100 and 110 of FIG. 3); otherwise, perform step (3) and (4) below (steps 105–110 of FIG. 3);

(2) compute parameters of the regular step;

$$\alpha_n := (\delta^{(\tau)})^{-1}(W^{(\tau)})^T A v_n, \qquad (9)$$
$$\alpha_n := (\delta^{(\tau)})^{-T}(V^{(\tau)})^T A^T w_n,$$

$$\beta_n := \begin{cases} (\delta^{(\tau-1)})^{-T}(W^{(\tau-1)})^T A v_n & \text{if } \tau > 1, \\ 0 & \text{if } \tau = 1, \end{cases}$$

$$\beta_n := \begin{cases} (\delta^{(\tau-1)})^{-T}(V^{(\tau-1)})^T A w_n & \text{if } \tau > 1, \\ 0 & \text{if } \tau = 1, \end{cases}$$

$$v := A v_n - V^{(\tau)}\alpha_n - V^{(\tau-1)}\beta_n,$$
$$w := A^T w_n - W^{(\tau)}\alpha_n - W^{(\tau-1)}\beta_n,$$
$$\tau := \tau + 1,$$

-continued
$$V^{(\tau)} := 0 \quad \text{(i.e. an empty matrix)},$$
$$W^{(\tau)} := 0 \quad \text{(i.e. an empty matrix)},$$

and proceed to step (4);

(3) compute parameters of the look-ahead step:

$$\beta_n := \begin{cases} (\delta^{(\tau-1)})^{-T}(W^{(\tau-1)})^T A v_n & \text{if } \tau > 1, \\ 0 & \text{if } \tau = 1, \end{cases} \quad (10)$$

$$\tilde{\beta}_n := \begin{cases} (\delta^{(\tau-1)})^{-T}(V^{(\tau-1)})^T A w_n & \text{if } \tau > 1, \\ 0 & \text{if } \tau = 1, \end{cases}$$

$$v := A v_n + v_n \|A\|_2 - V^{(\tau-1)}\beta_n,$$
$$w := A^T w_n + w_n \|A\|_2 - W^{(\tau-1)}\tilde{\beta}_n,$$

and proceed to step (4); and (4) if v=0 or w=0 (as determined in step 110 of FIG. 3), then stop computing steps (2) and (3) (step 125 in FIG. 3); otherwise, set $$\rho_{n+1} := \|v\|_2, \quad (11)$$
$$\eta_{n+1} := \|w\|_2,$$

$$v_{n+1} := \frac{v}{\rho_{n+1}},$$

$$w_{n+1} := \frac{w}{\eta_{n+1}},$$
$$V^{(\tau)} := [V^{(\tau)} \, v_{n+1}],$$
$$W^{(\tau)} := [W^{(\tau)} \, w_{n+1}],$$
$$\delta^{(\tau)} := (W^{(\tau)})^T V^{(\tau)}.$$

and continue step (2) and (3) as in steps 115–120 of FIG. 3. In steps (2) and (3) above, the following notation is used:

$$\delta^{-T} = (\delta^{31 \, 1})^T$$

for non-singular matrices δ. Also, as herein described, the use of "0" indicates the scalar value of zero or empty vectors or matrices, where appropriate. Thus, in step (2), the matrices $V^{(\tau)}$ and $W^{(\tau)}$ are set to be empty matrices.

The above steps (1) to (4) generate two sequences of vectors $v_1, v_2, \ldots, v_{q+1}$, and $w_1, w_2, \ldots, w_{q+1}$, which are grouped into two sequences of blocks $V^{(1)}, V^{(2)}, \ldots, V^{(\tau)}$ and $W^1, W^2 \, W^{(\tau)}$. These blocks of vectors are biorthogonal, i.e.

$$(W^{(j)})^T V^{(k)} = \begin{cases} \delta^{(j)} j & \text{if } j = k, \\ 0 & \text{if } j \neq k \end{cases} \quad (12)$$

for all j, k=0, 1, ..., τ, where $\delta^{(\tau)}$ is determined from Eq. (11) above.

Setting $V_q := [v_1 \, v_2 \ldots v_q]$ and $W_q := [w_1 \, w_2 \ldots w_q]$ as matrices with the Lanczos vectors $v_j$, $w_j$, j=1 ... q, as columns, block tridiagonal matrices $T_q$ and $\tilde{T}_q$ are then determined from the parameters computed in steps (1)–(4) of the above Lanczos process with look-ahead as described in Freund [1] and Freund [2], cited above, such that the following relationships to the circuit characteristic matrix A are satisfied:

$$AV_q = V_q T_q + [0 \ldots 0 \, v_{q+1}]\rho_{q+1}$$

$$A^T W_q = W_q \tilde{T}_q + [0 \ldots 0 \, w_{q+1}]\eta_{q+1} \quad (13)$$

It is noted that, if the above process stops in step (4), then $H_n$ equals the exact frequency response H(s).

The blocks of $T_q$ include the elements $\alpha_n$, $\beta_n$, and $\rho_n$, and the blocks of $\tilde{T}_q$ include the elements $\alpha_n$, $\tilde{\beta}_n$, and $\eta_n$, as determined in steps (1) to (4) above, and both of the block tridiagonal matrices $T_q$ and $\tilde{T}_q$ are upper Hessenberg matrices; i.e. the only non-zero elements below the diagonal are the elements on the first subdiagonal.

The block tridiagonal matrices satisfy the following relationship:

$$\tilde{T}_q^T = D_q T_q D_q^{-1} \quad (14)$$

where $$D_q = W_q^T V_q = diag(\delta^{(1)}, \delta^{(2)}, \ldots, \delta^{(\tau)}) \quad (15)$$

An eigendecomposition of $T_q$ results in $$T_q = S_q \, diag(\lambda_1, \lambda_2, \ldots, \lambda_q) S_q^{-1} = S_q \Lambda S_q^{-1} \quad (16)$$

where $\Lambda_q = diag(\Lambda_1, \Lambda_2, \ldots \Lambda_q)$ contains the eigenvalues of $T_q$.

The Lanczos process may be shown to be related to Padé approximation. For example, since $T_q$ is an upper Hessenberg matrix, using Eq. (13) above, $$l^T A^j r = \gamma_q e_q^T D_q T_q^j e_q, \, j=0, 1, \ldots, 2q-1, \quad (17)$$

where $e_1 = [1 \, 0 \ldots 0]^T \in \mathbf{R}$ is the first unit vector in $\mathbf{R}$ of length q, and $$\gamma_q := \frac{l^T r}{e_1^T D_q e_1} \quad (18)$$

from which it follows that $$H_q(s_0 + \sigma) = \gamma_q e_1^T D_q (I - \sigma T_q)^{-1} e_1 \quad (19)$$

is the $q^{th}$ Padé approximant.

By setting vectors $\mu = S_q^T D_q^T e_1$ and $\nu = S_q^{-1} e_1$, where $\mu_j$, $\nu_j$ are vector components of $\mu$, $\nu$, respectively, one may further derive that $$H_q(s_0 + \sigma) = \sum_{j=1}^{q} \frac{\gamma_q \cdot \mu_j \nu_j}{1 - \sigma \lambda_j} \quad (20)$$

which is the $q^{th}$ Padé approximant of H.

From Eq. (20), a pole/residue representation of the Padé approximant is found to be:

$$H_q(s_0 + \sigma) = k_\infty + \sum_{j=1, \lambda_j \neq 0}^{q} \frac{-\gamma_q \cdot \mu_j \nu_j / \lambda_j}{\sigma - 1/\lambda_j} \quad (21)$$

which provides the residue $k_\infty$ if one of the eigenvalues $\lambda_j$ of $T_q$ is zero.

The poles and residues of $H_q$ are determined according to:

$$p_j = 1/\lambda_j \quad (22)$$

$$k_\infty = \sum_{j=0, \lambda_j = 0}^{q} \gamma_q \cdot \mu_j \nu_j$$

$$k_j = \frac{\gamma_q \cdot \mu_j \nu_j}{\lambda_j}, \, \lambda_j \neq 0$$

It can also be shown that the reduced-order model or Padé approximant $H_q$ is determined from the block tridiagonal matrix $T_q$ by:

$$H_q(s_0 + \sigma) = \sigma^{\kappa-1} \frac{\det(I - \sigma T_q')}{\det(I - \sigma T_q)} \quad (23)$$

where $T_q'$ is a block tridiagonal matrix of order q–κ obtained from $T_q$ by deleting the first block row and first block column of $T_q$, and $\kappa$ denotes the size of the first block. By Eq. (23), the zeroes of $H_q$ are the inverses of the eigenvalues of $T_q'$.

The above described PVL procedure is used to obtain bounds for the pole approximation error. From Eq. (22), the poles of the $q^{th}$ Padé approximant $H_q$ are the inverses of the eigenvalues $\lambda_j$ of the block tridiagonal matrix $T_q$, while the poles of the exact impulse response H are the inverses of the eigenvalues of the characteristic matrix A, so a quality measure for the poles of $H_q$ can thus be obtained by checking the degree of approximation of the eigenvalues of $T_q$ to the eigenvalues of A.

Let $\lambda_j \in \mathbb{C}$ be any eigenvalue of $T_q$ with corresponding eigenvector $s_j \in \mathbb{C}$, so $T_q\,s_j=\lambda_j\,s_j$. Setting $z_j:=V_q\,s_j$ with $V_q$ defined above, and using Eq. (13), then $$Az_j - \lambda_j z_j = v_{q+1}\rho_{q+1}s_{qj} \qquad (24)$$

where $s_{qj}$ is the last component of the vector $s_j$. By taking the norms of both sides of Eq. (24), and since it can be shown that $\|v_{q+1}\|_2 = 1$, then $$\frac{\|Az_j - \lambda_j z_j\|_2}{\|A\|_2 \cdot \|s_j\|_2} = \frac{\rho_{q+1}|s_{qj}|}{\|A\|_2 \cdot \|s_j\|_2} \qquad (25)$$

The norm $\|A\|_w$ can be estimated by:

$$\|A\|_2 \geq \max_{n=1,2,\ldots,q} \{\|Av_n\|_2, \|A^T w_n\|_2\} = n(A) \qquad (26)$$

resulting in:

$$\frac{\|Az_j - \lambda_j z_j\|_2}{\|A\|_2 \cdot \|s_j\|_2} = \frac{\rho_{q+1}|s_{qj}|}{n(A)_2 \cdot \|s_j\|_2} = Q_j \qquad (27)$$

which represents a measure of the degree of approximation of the pair $(\lambda_j, z_j)$ to an eigenpair of the characteristic matrix A, and consequently a quality measure of the approximate pole $1/\lambda_j$ produced by the PVL procedure described above. $Q_j$ can be easily computed by the circuit analyzer 10 using processor 15 operating software subroutines to calculate the variables in Eq. (24)–(27) above and using the quantities generated by the PVL procedure; for example, the eigenvalues and eigenvectors calculated and stored in memory 20. The resulting values $Q_j$ for each pole may be listed in a file with the corresponding pole for output through output device 30 on a display or a hardcopy printout. $Q_j$ may be expressed as a decimal value or a percentage to indicate the degree of approximation of each respective pole to the corresponding actual pole.

In general, the Padé approximation generates poles that correspond to the dominant poles of the original system and a few poles of which do not have correspondence in the original system but account for the effects of the remaining original poles. The true poles can be identified by using the bound $Q_j$ presented above and by comparing the poles obtained at consecutive iterations of the PVL procedure. The true poles that have converged should not change significantly between iterations.

In use, the PVL procedure implemented by the circuit analyzer 10 provides improved numerically stable frequency response approximation of higher accuracy than previous circuit analysis methods such as AWE with comparable computational costs per order of approximation.

Figure 4:
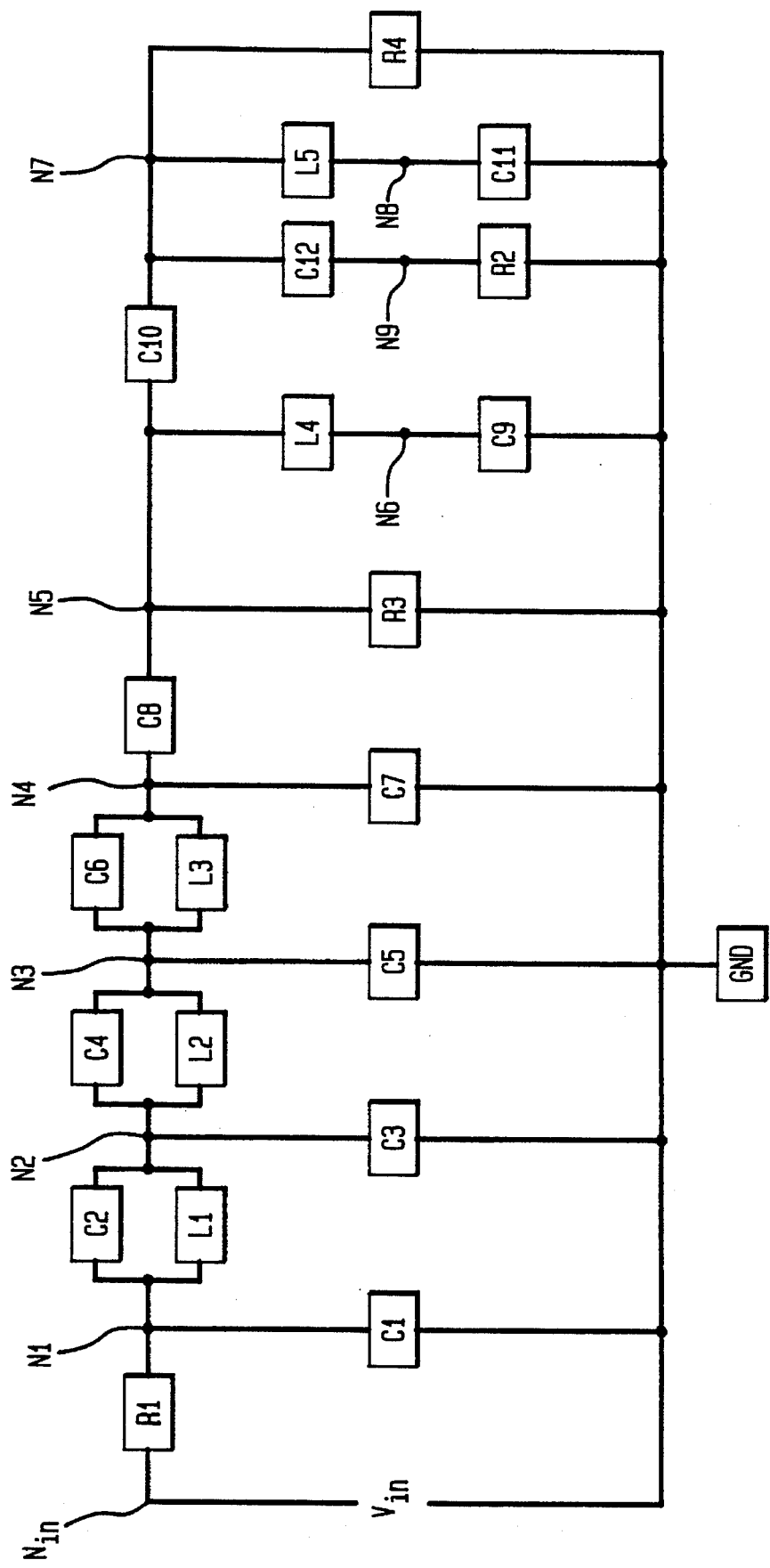
FIG. 4 shows an example filter circuit.

For example in analyzing the filter shown in FIG. 4, the filter has nodes $N_{in}$, N1, N2, ... N9 and the following components:

R1=50.0 ohm, R2=50.0 ohm,
R3=10.0 megaohm, R4=10.0 megaohm,
C1=69.0 picofarads (pf), C2=39.0 pf,
C3=139.0 pf, C4=39.0 pf,
C5=107.0 pf, C6=39.0 pf,
C7=68.0 pf, C8=3.98 pf,
C9=2.06 pf, C10=1.36 pf,
C11=9.46 pf, C12=2.13 pf,
L1=360.0 nanohenrys (nh),
L2=360.0 nh, L3=360.0 nh,
L4=4.8 microhenrys ($\mu$h), L5=2.66 $\mu$h, and the frequency response is selected from the nodes of the circuit according to the values of selection vector 1.

Figure 5:
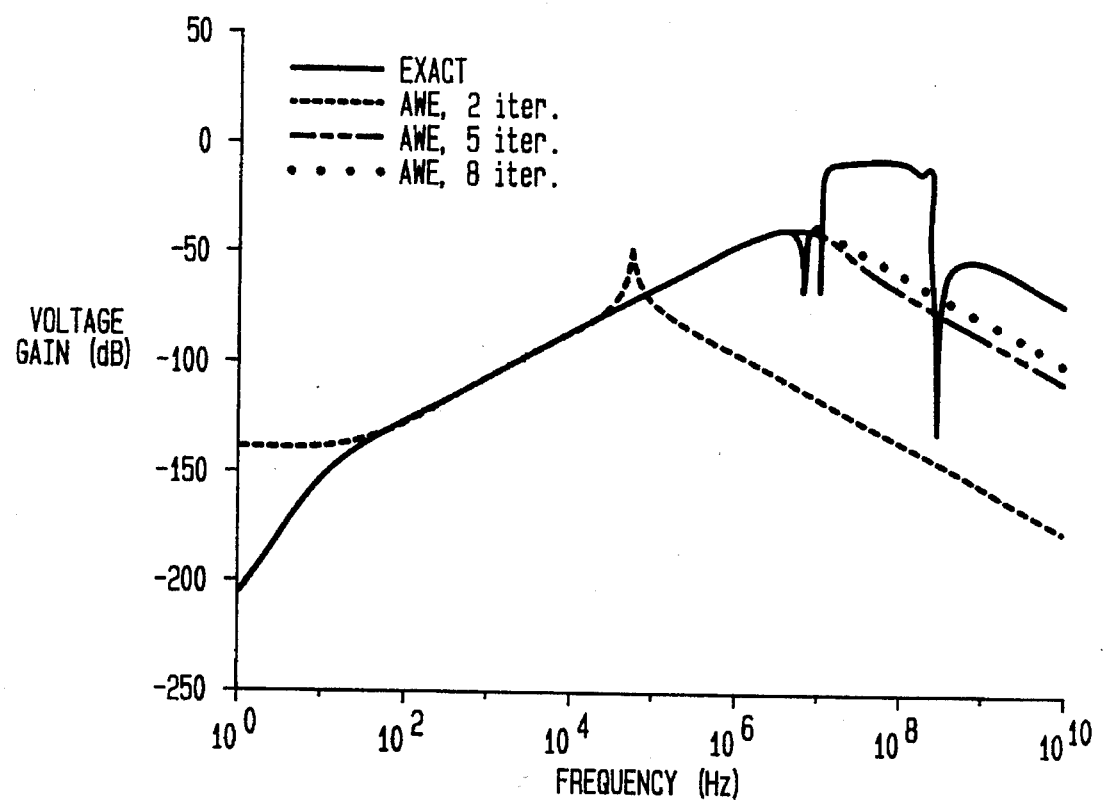
FIG. 5 illustrates a frequency response and AWE analysis of the circuit in FIG. 4.

Using AWE implemented in MATLAB™, a mathematics software package available from The MathWorks, Inc., the frequency response of the filter shown in FIG. 4 is approximated as illustrated in FIG. 5, where three iterations of AWE representing Padé approximations for q=2, 5, and 8 are shown superimposed over the exact frequency response of the filter. As shown in FIG. 5, increasing the iterations in AWE to higher orders does not increase the accuracy of the approximation for the cost of computation of the higher orders of iteration.

Figure 6:
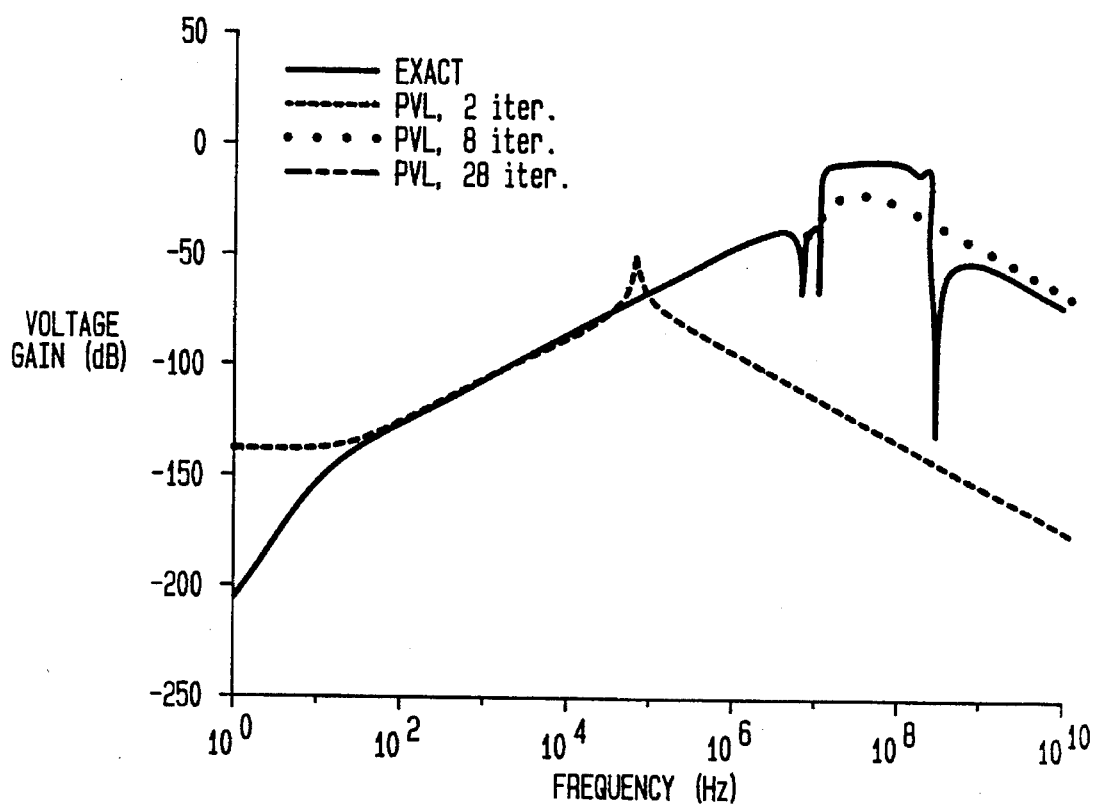
FIG. 6 illustrates the frequency response and PVL analysis of the circuit in FIG. 4.

In comparison, the circuit analyzer 10 implementing the PVL procedure disclosed herein generates Padé approximants to the transfer function and displays a graphical representation thereof on a display as illustrated in FIG. 6. The PVL results are shown for q=2, 8, and 28, with the q=28 iteration overlying the exact frequency response; i.e. the q=28 iteration is indistinguishable (within the resolution of the graphical representation) and approaching exactitude in approximation. As evident from FIG. 6, the approximant for q=8 obtained from the PVL procedure of the circuit analyzer 10 is more accurate than the comparable q=8 iteration of AWE, as shown in FIG. 5, and, as described above, the PVL procedure provides computational costs comparable to AWE with increased numerical stability.

Figure 7:
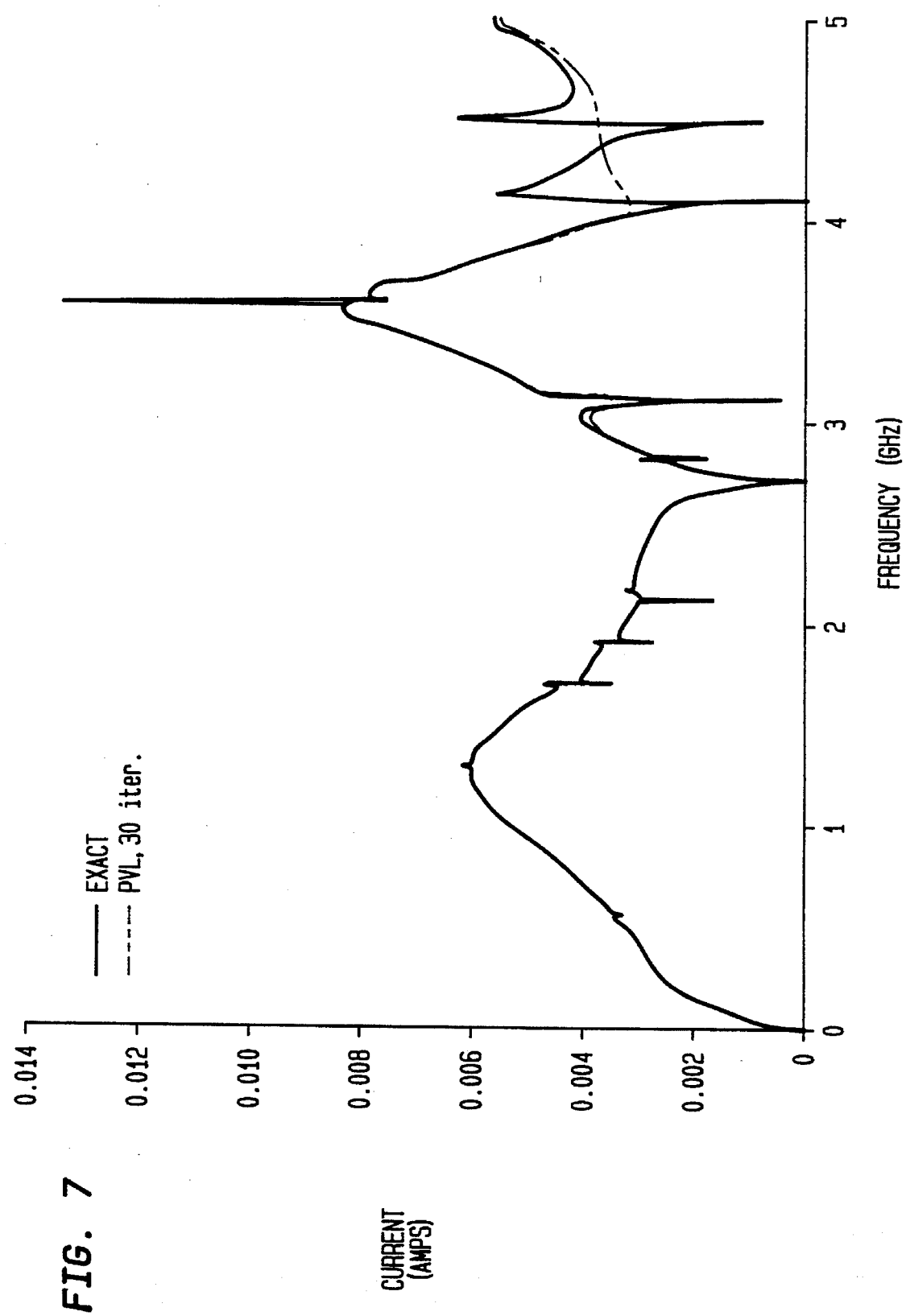
FIG. 7 illustrates a frequency response and PVL analysis of a second example circuit.
Figure 8:
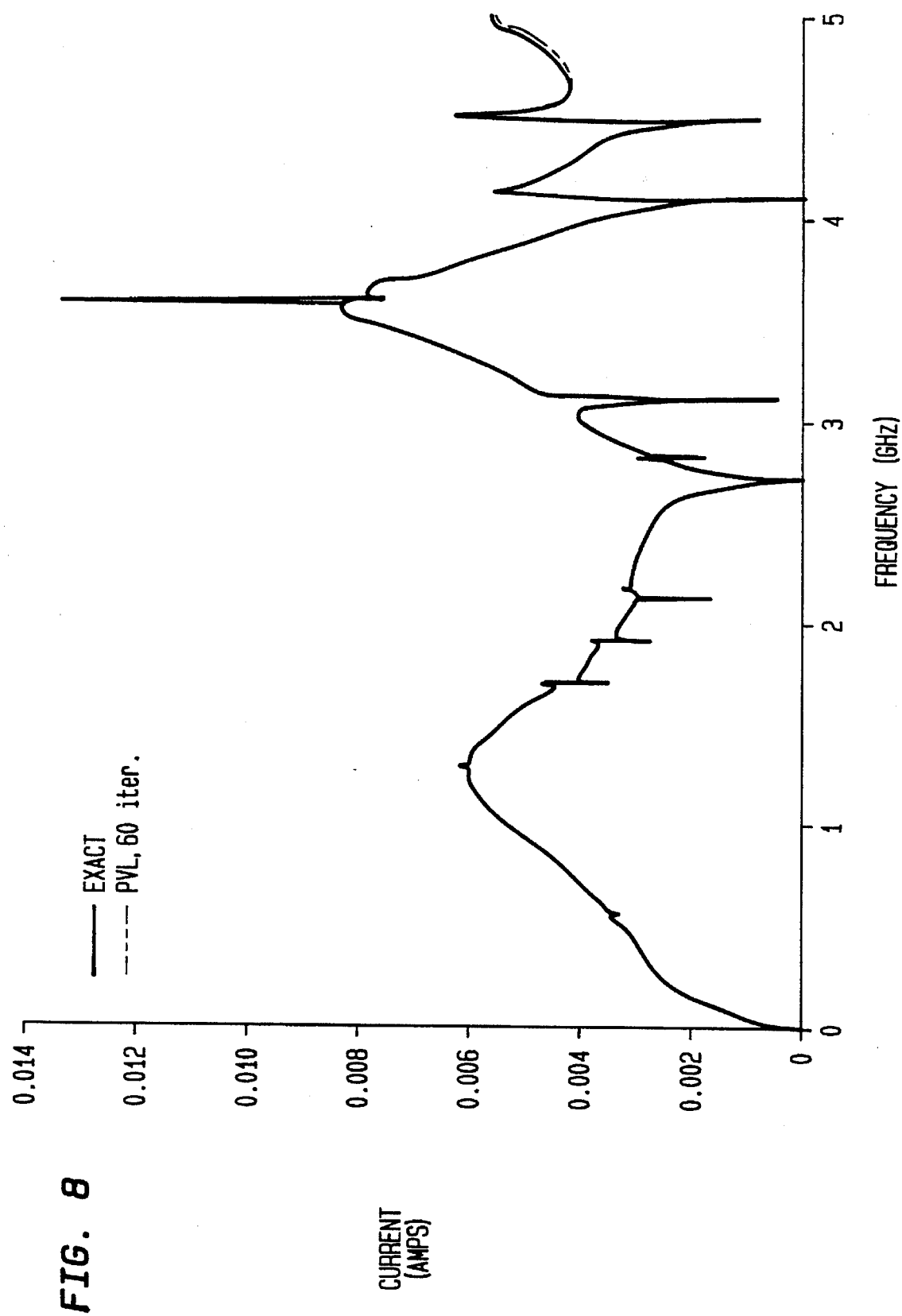
FIG. 8 illustrates the PVL analysis of the second example circuit after further iterations.

Another exemplary performance of the PVL procedure by the disclosed circuit analyzer 10 is shown in FIGS. 7–8, in analyzing a more complicated circuit such as a lumpedelement equivalent circuit for a three-dimensional electromagnetic problem modeled via a partial element equivalent circuit (PEEC) consisting of 2100 capacitors, 172 inductors, and 6990 inductive couplings. As illustrated in FIG. 7, the circuit analyzer 10 provides substantial accuracy up to 4 GHz for 30 iterations, with the displayed approximation by PVL overlying the exact response of the circuit. As shown in FIG. 7, various poles are accurately approximated, for example, at about 2.1 GHz and about 3.5 GHz, and a zero is accurately approximated at about 2.7 GHz. For 60 iterations, the circuit analyzer 10 described herein provides an approximation shown in FIG. 8 overlying the exact response substantially identical to the exact response up to about 5 GHz. In addition to the poles and zeros approximated for 30 iterations in FIG. 7, for 60 iterations shown in FIG. 8, poles and zeros are accurately approximated within the 4 GHz to 5 GHz range, such as a pole at about 4.5 GHz and a zero at about 4.1 GHz. The circuit analyzer 10 provides the frequencies of the approximated poles and zeros with any arbitrary number of decimal values.

In comparison, AWE reproduces the transfer function of the PEEC circuit discussed above accurately only up to 1 GHz, according to H. Heeb et al., Three-Dimensional Circuit Oriented Electromagnetic Modeling for VLSI Interconnects, PROC. OF THE 1992 IEEE INTERNATIONAL CONF. ON COMPUTER DESIGN: VLSI IN COMPUTERS & PROCESSORS, pp. 218–221, October 1992. However, through the use of multi-point moment matching, as discussed in E. Chiprout et al., Generalized Moment-Matching Methods for Transient Analysis of Interconnect Networks, PROC. OF THE 29TH ACM/IEEE DESIGN AUTOMATION CONF., pp. 201–206, June, 1992; the AWE technique may achieve a sufficient number of accurate poles and zeros to extend the accuracy of the approximation up to 5 GHz. However, this improved implementation of AWE is attained at the more expensive computational cost of almost two orders of magnitude using an additional complex circuit matrix factorization for each of 12 complex points used to generate moments for the AWE method, while the AWE method is accurate up to 1 GHz required one real circuit matrix factorization.

The circuit analyzer 10 implementing the PVL procedure described herein uses one real circuit matrix factorization, but is accurate up to 5 GHz. The implementation herein described of the Padé via Lanczos method, using a look-ahead variation of the Lanczos iterative recursions, by the circuit analyzer 10 of the present invention thus provides superior approximations to the frequency response of large linear networks. The circuit analyzer 10 generates an accurate approximation of the analyzed circuit, and so may be used as a component in a system performing as the actual circuit and also to simulate the actual circuit in other applications.

While the disclosed circuit analyzer and method has been particularly shown and described with reference to the preferred embodiments, it will be understood by those skilled in the art that various modifications in form and detail may be made therein without departing from the scope and spirit of the invention. Accordingly, modifications such as those suggested above, but not limited thereto, are to be considered within the scope of the invention.

What is claimed is:

1. An apparatus for generating a frequency response signal of a circuit, the apparatus comprising:

a processing unit including a processor, associated memory, and stored programs, the memory for storing circuit characteristic data representing the circuit, the stored programs include a matrix reduction program for causing the processor to process the circuit characteristic data and to generate block tridiagonal matrix data representing a block tridiagonal matrix relating to the circuit characteristic data, and for generating the frequency response signal from the block tridiagonal matrix data.

2. The apparatus of claim 1 wherein the processor processes the block tridiagonal matrix data to calculate an eigenvalue of the block tridiagonal matrix and generates the frequency response signal therefrom.

3. The apparatus of claim 2 wherein the processor determines a pole from the eigenvalue and generates the frequency response signal from the pole.

4. The apparatus of claim 3 wherein the processor processes the block tridiagonal matrix data to calculate an eigenvector of the block tridiagonal matrix, and determines a residue from the eigenvector and the eigenvalue to generate the frequency response signal.

5. The apparatus of claim 1 wherein the processor determines a zero from the block tridiagonal matrix data and generates the frequency response signal from the zero.

6. The apparatus of claim 1 wherein the processor generates the frequency response signal according to an impulse response transfer function $$H_q(s_0+\tau) = \gamma_q e_1^T D_q (I-\tau T_q)^{-1} e_1$$

where $T_q$ is the block tridiagonal matrix, I is an identity matrix, $e_1$ is a unit vector, and $D_q$ and $\gamma_q$ are generated by the processor using the circuit characteristic data.

7. An apparatus for generating a frequency response signal indicative of an impulse response of a circuit, the apparatus comprising:

a data source providing circuit characteristic data representing the circuit; and a processing unit including a processor, associated memory, and stored programs, the memory for receiving and storing the circuit characteristic data from the data source, the stored programs include a matrix reduction program for causing the processor to process the circuit characteristic data, to use determining means for generating block tridiagonal matrix data representing a block tridiagonal matrix relating to the circuit characteristic data, and to use generating means for generating the frequency response signal from the block tridiagonal matrix data.

8. The apparatus of claim 7 wherein the determining means calculates characteristic matrix data representing a characteristic matrix of the circuit characteristic data, and determines the block tridiagonal matrix data from the characteristic matrix data.

9. The apparatus of claim 8 wherein the determining means processes the matrix characteristic data to reduce the characteristic matrix and to determine the block tridiagonal matrix data therefrom.

10. The apparatus of claim 9 wherein the determining means processes the characteristic matrix data to determine the block tridiagonal matrix data for determining a Padé approximant of a transfer function of the circuit using a Lanczos procedure.

11. The apparatus of claim 10 wherein the determining means iteratively processes the characteristic data to iteratively reduce the characteristic matrix using a look-ahead determination in the Lanczos procedure.

12. The apparatus of claim 10 wherein the generating means calculates a pole of the impulse response from the block tridiagonal matrix data to generate the frequency response signal.

13. The apparatus of claim 10 wherein the generating means calculates a zero of the impulse response from the block tridiagonal matrix data to generate the frequency response signal.

14. A circuit analyzer for generating a graphic representation of a predicted performance of a circuit, the circuit analyzer comprising:

an input device for inputting a plurality of circuit parameters representing the circuit;

memory and stored programs for receiving and storing the circuit parameters;

a processor operating with the stored programs and including:

means for processing the circuit parameters;

means for performing a Lanczos procedure on the processed parameters to determine a block tridiaqonal matrix;

means for calculating a Padé approximant, including poles and zeros thereof, of a transfer function of the circuit from the block tridiaqonal matrix; and means for generating the graphic representation from the Padé approximant to predict the performance of the circuit; and a display for displaying the graphic representation.

15. The apparatus of claim 14 wherein the Lanczos procedure performing means performs the Lanczos procedure with a look-ahead determination using matrix data representing a non-singular matrix.

16. The apparatus of claim 14 wherein the Lanczos procedure performing means iteratively generates a plurality of intermediate parameters from the processed circuit parameters and stores the generated intermediate parameters in the memory.

17. The apparatus of claim 16 wherein the intermediate parameters of an $n^{th}$ iteration includes matrix data representing a non-singular matrix, the inverse thereof used by the Lanczos procedure performing means to generate an $(n+1)^{th}$ iteration of intermediate parameters.

18. The apparatus of claim 16 wherein the Lanczos procedure performing means generates block tridiagonal matrix data representing a block tridiagonal matrix from the stored intermediate parameters.

19. The apparatus of claim 16 wherein the calculating means generates eigenvalues and eigenvectors of the block tridiagonal matrix from the block tridiagonal matrix data to calculate the Padé approximant.

20. A method for generating a frequency response signal of a circuit, the method comprising the steps of:

storing circuit characteristic data representing the circuit in memory;

processing the circuit characteristic data to generate characteristic matrix data representing a characteristic matrix using a processor;

determining block tridiagonal matrix data representing a block tridiagonal matrix from the characteristic matrix data using the processor operating a matrix reduction program; and generating the frequency response signal from the block tridiagonal matrix data.

21. The method of claim 20 wherein the step of generating includes the step of calculating an eigenvalue of the block tridiagonal matrix from the block tridiagonal matrix data to generate the frequency response signal therefrom.

22. The method of claim 20 wherein the step of generating includes the step of determining a pole from the eigenvalue to generate the frequency response signal therefrom.

23. The method of claim 20 wherein the step of generating includes the steps of:

calculating an eigenvector of the block tridiagonal matrix from the block tridiagonal matrix data; and determining a residue from the eigenvector and the eigenvalue to generate the frequency response signal therefrom.

24. The method of claim 20 wherein the step of generating includes the step of determining a zero from the block tridiagonal matrix data to generate the frequency response signal therefrom.

25. The method of claim 20 wherein the step of generating includes the step of determining an impulse response transfer function $$H_q(S_0+\tau) = \gamma_q e_1^T D_q (I-\tau T_q)^{-1} e_1$$

to generate the frequency response signal therefrom, where $T_q$ is the block tridiagonal matrix, $I$ is an identity matrix, $e_1$ is a unit vector, and $D_q$ and $\gamma_q$ are generated by the processor using the circuit characteristic data.

26. A method for analyzing a circuit to predict performance of a circuit, comprising the steps of:

receiving a plurality of circuit parameters representing the circuit from an input device;

storing the received circuit parameters in memory;

processing the circuit parameters to generate characteristic matrix data representing a characteristic matrix;

performing a Lanczos procedure on the processed parameters to generate block tridiagonal matrix data representing a block tridiaqonal matrix;

calculating a Padé approximant, including poles and zeros thereof, of a transfer function of the circuit from the block tridiagonal matrix data;

generating a graphic representation from the Padé approximant to predict the performance of the circuit; and displaying the graphic representation on a display.

27. The method of claim 26 wherein the step of performing the Lanczos procedure includes the step of performing a look-ahead determination using matrix data representing a non-singular matrix.

28. The method of claim 26 wherein the step of performing the Lanczos procedure includes the steps of:

iteratively generating a plurality of intermediate parameters from the processed parameters; and storing the generated intermediate parameters in the memory.

29. The method of claim 26 wherein the step of performing the Lanczos procedure includes the step of generating block tridiagonal matrix data representing a block tridiagonal matrix from the stored intermediate parameters.

30. The method of claim 26 wherein the step of calculating the Padé approximant includes the step of generating eigenvalues and eigenvectors of the block tridiagonal matrix from the block tridiagonal matrix data to calculate the Padé approximant therefrom.

* * * * *